(12) United States Patent
Park

(10) Patent No.: US 9,268,182 B2
(45) Date of Patent: Feb. 23, 2016

(54) COLOR FILTER SUBSTRATE, TFT ARRAY SUBSTRATE, MANUFACTURING METHOD OF THE SAME, AND LIQUID CRYSTAL DISPLAY PANEL

(71) Applicant: BEIJING BOE OPTOELECTRONICS TECHNOLOGY CO., LTD., Beijing (CN)

(72) Inventor: Sang Jin Park, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 201 days.

(21) Appl. No.: 13/805,029

(22) PCT Filed: Nov. 8, 2012

(86) PCT No.: PCT/CN2012/084318
§ 371 (c)(1),
(2) Date: Dec. 18, 2012

(87) PCT Pub. No.: WO2013/071838
PCT Pub. Date: May 23, 2013

(65) Prior Publication Data
US 2014/0071553 A1  Mar. 13, 2014

(30) Foreign Application Priority Data

Nov. 16, 2011  (CN) .......................... 2011 1 0369001

(51) Int. Cl.
G02B 5/22 (2006.01)
G02F 1/1362 (2006.01)
G02F 1/1368 (2006.01)
H01L 27/12 (2006.01)
G02F 1/1343 (2006.01)
G02F 1/1335 (2006.01)
(Continued)

(52) U.S. Cl.
CPC ............ G02F 1/136209 (2013.01); G02B 5/22 (2013.01); G02F 1/1368 (2013.01);
(Continued)

(58) Field of Classification Search
None
See application file for complete search history.

(56) References Cited

U.S. PATENT DOCUMENTS

2002/0044253 A1   4/2002  Masuda et al.
2002/0075435 A1*  6/2002  Lee et al. ...................... 349/129
(Continued)

FOREIGN PATENT DOCUMENTS

CN   1444082 A   9/2003
CN   1632666 A   6/2005
(Continued)

OTHER PUBLICATIONS

First Chinese Office Action dated Dec. 31, 2013; Appl. No. 201110369001.X.
(Continued)

*Primary Examiner* — Jade R Chwasz
(74) *Attorney, Agent, or Firm* — Ladas & Parry LLP

(57) ABSTRACT

Embodiments of the invention provide a color filter substrate, a TFT array substrate, a manufacturing method of the color filter substrate, a manufacturing method of the TFT array substrate, and a liquid crystal display (LCD) panel. The color filter substrate comprises color filter substrate units of different sizes. The manufacturing method of the color filter substrate comprises: coating a common electrode layer on a base substrate for forming the color filter substrate; and forming common electrodes of different thicknesses for the color filter substrate units of different sizes by a patterning process.

8 Claims, 7 Drawing Sheets

(51) Int. Cl.
G02F 1/1333 (2006.01)

(52) U.S. Cl.
CPC ........ *G02F1/13439* (2013.01); *H01L 27/1259* (2013.01); *G02F 1/133351* (2013.01); *G02F 1/133516* (2013.01); *G02F 2001/134318* (2013.01); *G02F 2001/136236* (2013.01); *G02F 2201/121* (2013.01)

(56) References Cited

U.S. PATENT DOCUMENTS

| 2003/0168055 | A1 | 9/2003 | Chae |
| 2006/0033876 | A1 | 2/2006 | Park et al. |
| 2010/0208153 | A1* | 8/2010 | Liu ............................. 349/38 |
| 2011/0187669 | A1* | 8/2011 | Abiru et al. ................ 345/173 |

FOREIGN PATENT DOCUMENTS

| CN | 1726427 A | 1/2006 |
| CN | 1316292 C | 5/2007 |
| CN | 101221326 A | * 7/2008 |
| CN | 102033345 A | * 4/2011 |
| CN | 102629018 A | 8/2012 |
| JP | 09-325328 A | 12/1997 |

OTHER PUBLICATIONS

International Search Report mailed Jan. 17, 2013; PCT/CN2012/084318.

Third Chinese Office Action dated Jul. 30, 2015; Appln. No. 201110369001.X.

* cited by examiner

| coating a common electrode layer on a substrate formed with black matrix and color filter layer | ~S201 |

| utilizing a half-tone mask or a gray-tone mask to perform a patterning process on the common electrode layer, so as to obtain common electrodes of different thicknesses for color filter substrate units of different sizes | ~S202 |

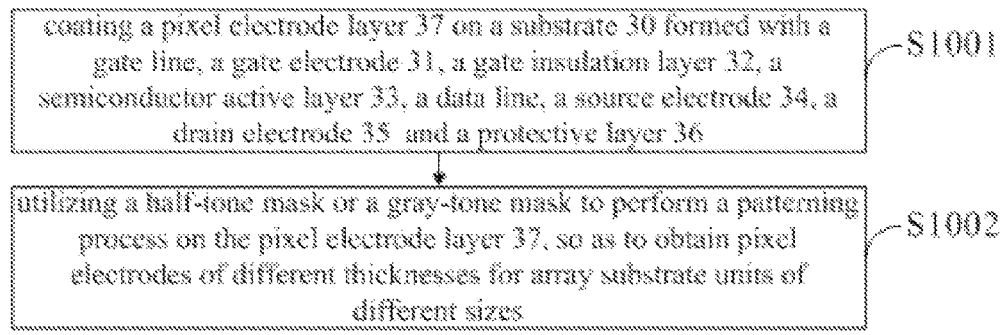
Fig. 10
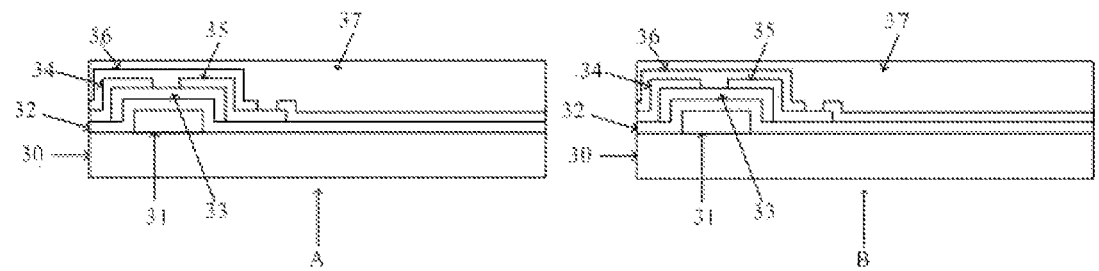
Fig. 11
Fig. 12

COLOR FILTER SUBSTRATE, TFT ARRAY SUBSTRATE, MANUFACTURING METHOD OF THE SAME, AND LIQUID CRYSTAL DISPLAY PANEL

FIELD OF THE INVENTION

Embodiments of the invention relate to a color filter substrate, a TFT array substrate, a manufacturing method of the color filter substrate, a manufacturing method of the TFT array substrate, and a liquid crystal display (LCD) panel.

BACKGROUND

Display panel of a Thin Film Transistor-Liquid Crystal Display (TFT-LCD) comprises a TFT array substrate and a color filter substrate bonded with each other and a liquid crystal layer filled between the TFT array substrate and the color filter substrate. In practice, display panel units of different sizes may be provided on a same display panel. After the bonding process of the color filter substrate and the TFT array substrate, the display panel will be divided into display panel units of different sizes.

Cell gaps of the different sized display panel units are required to be different from each other. However, when different sized display panel units are manufactured on the same display panel, the cell gaps thereof tend to be the same because the thicknesses of the TFT array substrate and the thickness of the color filter substrate are kept constant, and in this case, the display performance of some display panel units has to be adversely influenced.

SUMMARY OF THE INVENTION

According to one aspect of the invention, there is provided a manufacturing method of a color filter substrate. The color filter substrate comprises color filter substrate units of different sizes. The manufacturing method of the color filter substrate comprises: coating a common electrode layer on a base substrate for forming the color filter substrate; and forming common electrodes of different thicknesses for the color filter substrate units of different sizes by a patterning process.

According to another aspect of the invention, there is provided a color filter substrate. The color filter substrate has color filter substrate units of different sizes, and each of the color filter substrate units comprises a common electrode. The common electrodes of the color filter substrate units of different sizes have different thicknesses.

According to another aspect of the invention, there is provided a manufacturing method of a TFT array substrate. The TFT array substrate has array substrate units of different sizes. The method comprises: coating a pixel electrode layer on a base substrate for forming the TFT array substrate; and forming pixel electrodes of different thicknesses for the array substrate units of different sizes by a patterning process.

According to another aspect of the invention, there is provided a TFT array substrate. The TFT array substrate has array substrate units of different sizes, and each of the array substrate units comprises a pixel electrode. The pixel electrodes of the array substrate units of different sizes have different thicknesses.

According to another aspect of the invention, there is provided a liquid crystal display panel (LCD). The LCD panel comprises a color filter substrate and a TFT array substrate bonded with each other and a liquid crystal layer sandwiched between the color filter substrate and the TFT array substrate. The LCD panel has LCD panel units of different sizes, and the color filter substrate of each of the LCD panel units comprises a common electrode. The common electrodes of the LCD panel units of different sizes have different thicknesses, so that the LCD panel units of different sizes have different cell gaps.

According to a further aspect of the invention, there is provided a liquid crystal display panel (LCD). The LCD panel comprises a color filter substrate and a TFT array substrate bonded with each other and a liquid crystal layer sandwiched between the color filter substrate and the TFT array substrate. The LCD panel has LCD panel units of different sizes, and the array substrate of each of the LCD panel units comprises a pixel electrode. The pixel electrodes of the LCD panel units of different sizes have different thicknesses, so that the LCD panel units of different sizes have different cell gaps.

According to the embodiments of the invention, the common electrodes on the color filter substrate or the pixel electrodes on the TFT array substrate can have different thicknesses by a single patterning process with a half-tone mask or a gray-tone mask, so that display panel units of different cell gaps can be obtained in the later boding process. Therefore, the display panel units of different sizes on the same display panel can have their desired cell gaps, and thereby the display performances of the display panel units of different sizes can be simultaneously ensured.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 10 is a schematic view showing a process flow of a manufacturing method of a TFT array substrate according to an embodiment of the invention;

FIG. 11 is a first schematic view showing the structure of the TFT array substrate during performing the manufacturing method of the TFT array substrate according to the embodiment of the invention;

FIG. 12 is a second schematic view showing the structure of the TFT array substrate during performing the manufacturing method of the TFT array substrate according to the embodiment of the invention;

DESCRIPTION OF THE EMBODIMENTS

In order to make objects, technical solutions and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figures 1, 2:
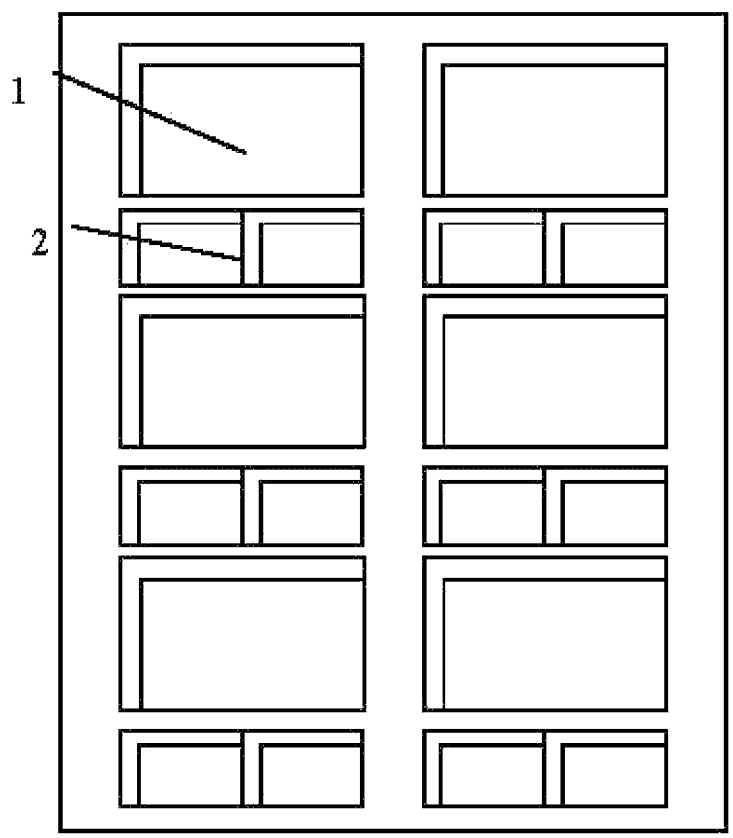
FIG. 1 is a schematic view showing a planar structure of a liquid crystal display (LCD) panel.
FIG. 2 is a schematic view showing a process flow of a manufacturing method of a color filter substrate according to an embodiment of the invention.

FIG. 1 is a schematic view showing a planar structure of a liquid crystal display (LCD) panel. The LCD panel comprises a color filter substrate, a TFT array substrate, and a liquid crystal layer filled between the color filter substrate and the array substrate. As shown in FIG. 1, the LCD panel has first-size LCD panel units 1 and second-size LCD panel units 2. The size of the first-size LCD panel unit 1 is different from that of the second-size LCD panel unit 2. In order that the first-size LCD panel unit 1 and the second-size LCD panel unit 2 simultaneously have excellent display performance, the cell gap of the first-size LCD panel unit 1 is desired to be different from that of the second-size LCD panel unit 2.

It should be noted that, the size of the first-size LCD panel unit 1 is larger than that of the second-size LCD panel unit 2 in FIG. 1, but it is not necessary that the cell gap of the first-size LCD panel unit 1 is larger than that of the second-size LCD panel unit 2 as well. Depending on the practical requirements, the cell gap of the first-size LCD panel unit 1 may be larger than or smaller than that of the second-size LCD panel unit 2.

Embodiment 1

Hereinafter, a manufacturing method of a color filter substrate according to an embodiment of the invention will be explained with reference to FIG. 2 to FIG. 9. As shown in FIG. 2, the method comprises the following steps.

S201: coating a common electrode layer on a substrate formed with black matrix and color filter layer.

Figure 3:
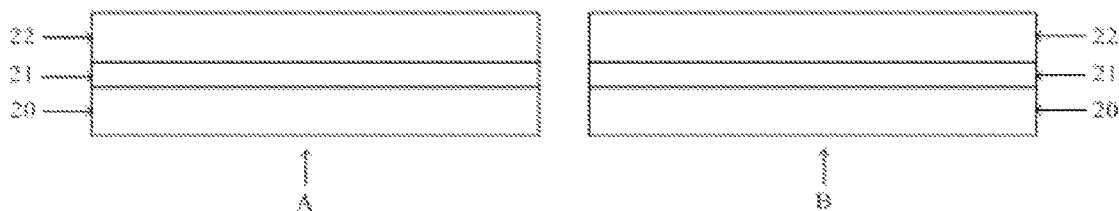
FIG. 3 is a first schematic view showing the structure of the color filter substrate during performing the manufacturing method of the color filter substrate according to the embodiment of the invention.

As shown in FIG. 3, the common electrode layer 22 is deposited on the substrate 20 formed with black matrix and color filter layer 21 by a magnetron sputtering method or a thermal evaporation method. For example, the common electrode layer 22 is transparent and is formed by ITO (Indium Tin Oxide).

S202: utilizing a half-tone mask or a gray-tone mask to perform a patterning process on the common electrode layer, so as to obtain common electrodes of different thicknesses for color filter substrate units of different sizes.

Figure 4:
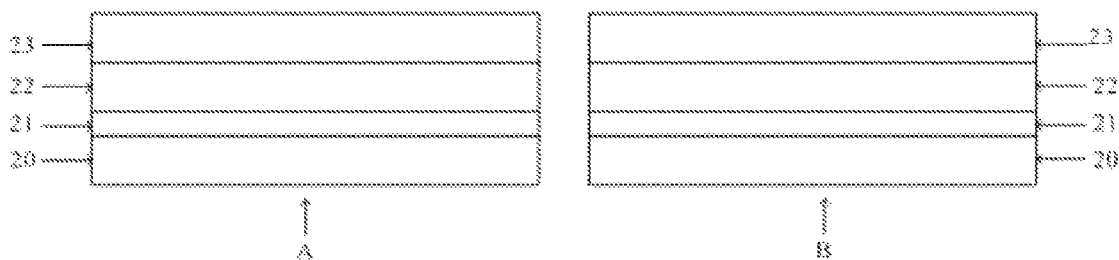
FIG. 4 is a second schematic view showing the structure of the color filter substrate during performing the manufacturing method of the color filter substrate according to the embodiment of the invention.

First, as shown in FIG. 4, a photoresist layer 23 is coated on the common electrode layer 22.

Figure 5:
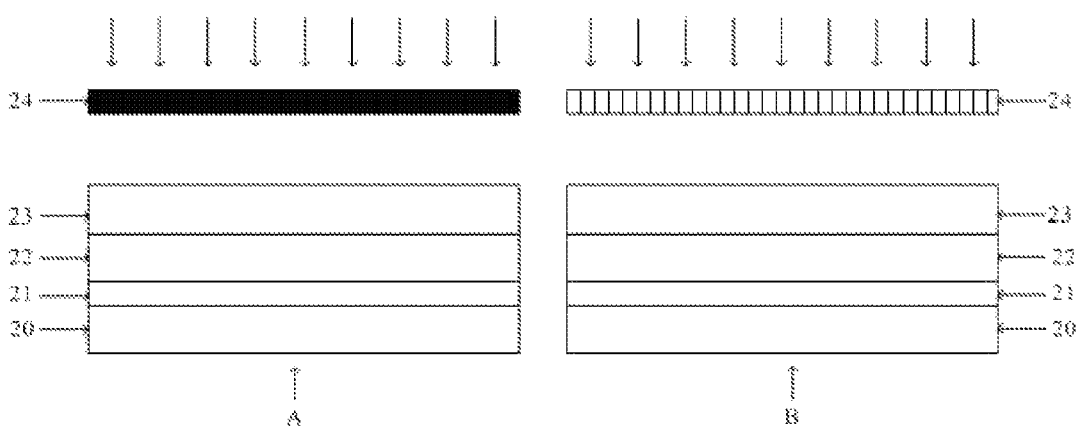
FIG. 5 is a third schematic view showing the structure of the color filter substrate during performing the manufacturing method of the color filter substrate according to the embodiment of the invention.
Figure 6:
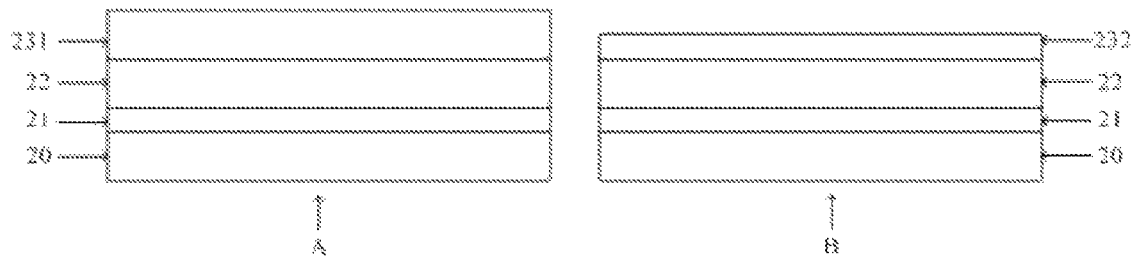
FIG. 6 is a fourth schematic view showing the structure of the color filter substrate during performing the manufacturing method of the color filter substrate according to the embodiment of the invention.

Next, as shown in FIG. 5, the photoresist layer 23 is exposed by a half-tone mask or a gray-tone mask 24. As shown in FIG. 6, a photoresist-completely-remained region 231, a photoresist-partially-remained region 232 and a photoresist-completely-removed region (not shown in FIG. 6) are formed after the photoresist layer 23 is developed. The photoresist-completely-remained region 231 corresponds to a region in which a common electrode of a first-size color filter substrate unit A is to be formed, and the photoresist-partially-remained region 232 corresponds to a region in which a common electrode of a second-size color filter substrate unit B is to be formed.

Then, the common electrode layer in the photoresist-completely-removed region is removed by an etching process.

Figure 7:
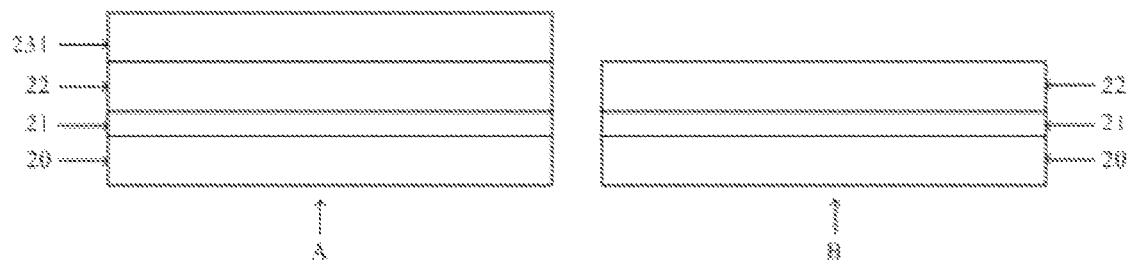
FIG. 7 is a fifth schematic view showing the structure of the color filter substrate during performing the manufacturing method of the color filter substrate according to the embodiment of the invention.
Figure 8:
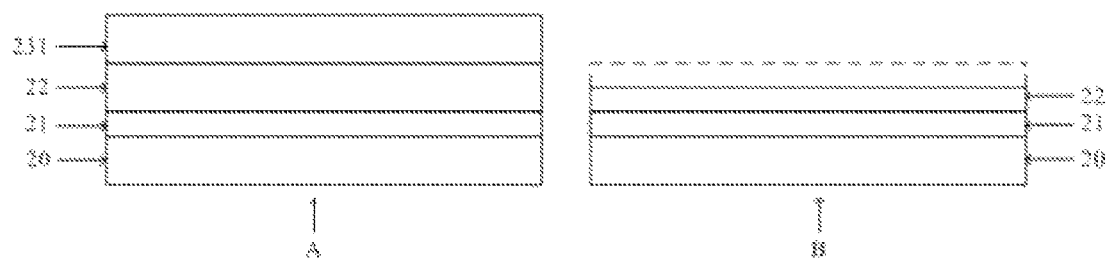
FIG. 8 is a sixth schematic view showing the structure of the color filter substrate during performing the manufacturing method of the color filter substrate according to the embodiment of the invention.

Next, as shown in FIG. 7, the photoresist in the photoresist-partially-remained region 232 is removed by a plasma ashing process, for example. Then, as shown in FIG. 8, the common electrode layer 22 in this region is etched by a certain thickness.

Figure 9:
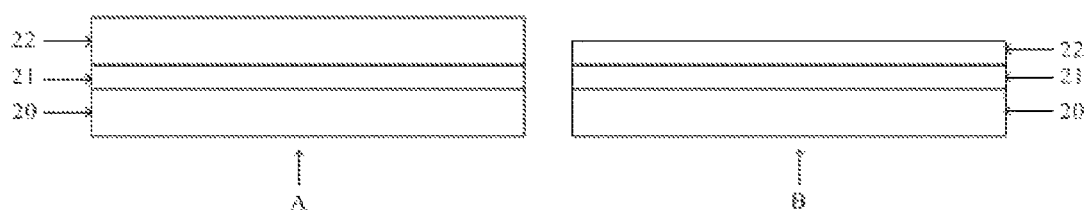
FIG. 9 is a seventh schematic view showing the structure of the color filter substrate during performing the manufacturing method of the color filter substrate according to the embodiment of the invention.

Finally, as shown in FIG. 9, the photoresist in the photoresist-completely-remained region 232 is peeled off.

According to the manufacturing method of the color filter substrate in the embodiment of the invention, the common electrodes of different thicknesses can be formed on the same color filter substrate by a single patterning process with a half-tone mask or a gray-tone mask, so that display panel units of different cell gaps can be obtained in the later bonding process. Therefore, the display panel units of different sizes on the same display panel can have their desired cell gaps, and thereby the display performances of the display panel units of different sizes can be simultaneously ensured.

In addition, according to the embodiment, a color filter substrate is provided. As shown in FIG. 9, the color filter substrate comprises a first-size color filter substrate unit A and a second-size color filter substrate unit B, and the size of the first-size color filter substrate unit A is different from that of the second-size color filter substrate unit B. Each of the color filter substrate units A and B comprises a common electrode 22, and the thicknesses of the common electrode 22 of the first-size color filter substrate unit A is different from the thickness of the common electrode 22 of the second-size color filter substrate B. In FIG. 9, the thickness of the common electrode 22 of the first-size color filter substrate unit A is larger than the thickness of the common electrode 22 of the second-size color filter substrate unit B.

In this way, since the thicknesses of the common electrodes of the color filter substrate units are different from each other, display panel units of different cell gaps can be obtained in the later bonding process. Therefore, the display panel units of different sizes on the same display panel can have their desired cell gaps, and thereby the display performances of the display panel units of different sizes can be simultaneously ensured.

In this embodiment, as an example, the display panel units of different cell gaps are realized by allowing the common electrodes on the color filter substrate to have different thicknesses. However, it should be noted that other structural layers such as a protective layer on the color filter substrate may be allowed to have different thicknesses so as to realize the display panel units of different cell gaps. For example, the protective layer is firstly coated on the substrate formed with black matrix and color filter layer, then the protective layer is patterned to have different thickness by a patterning process, and finally the common electrode layer is formed on the patterned protective layer.

Embodiment 2

Hereinafter, a manufacturing method of a TFT array substrate according to an embodiment of the invention will be explained with reference to FIG. 10 to FIG. 18. As shown in FIG. 10, the method comprises the following steps.

S1001: coating a pixel electrode layer 37 on a substrate 30 formed with a gate line, a gate electrode 31, a gate insulation layer 32, a semiconductor active layer 33, a data line, a source electrode 34, a drain electrode 35 and a protective layer 36, as shown in FIG. 11.

S1002: utilizing a half-tone mask or a gray-tone mask to perform a patterning process on the pixel electrode layer, so as to obtain pixel electrodes of different thicknesses for array substrate units of different sizes.

As shown in FIG. 12, a photoresist layer 38 is firstly coated on the pixel electrode layer 37.

Figure 13:
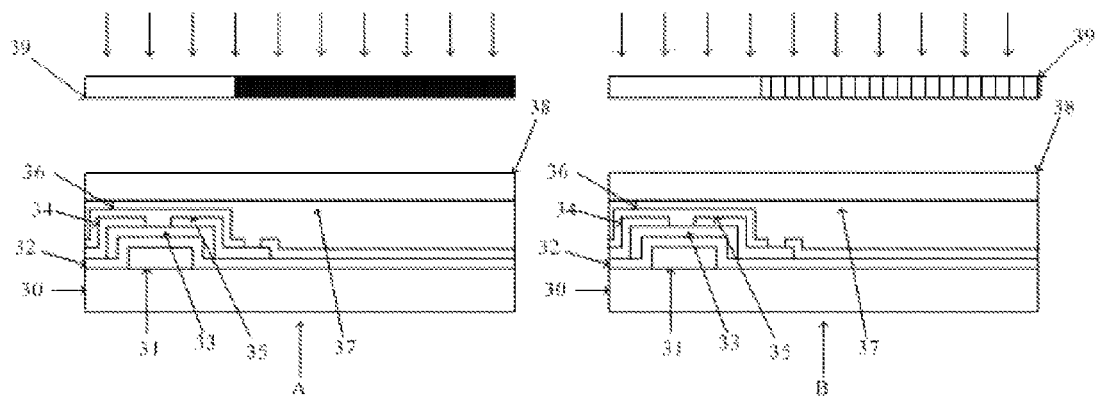
FIG. 13 is a third schematic view showing the structure of the TFT array substrate during performing the manufacturing method of the TFT array substrate according to the embodiment of the invention.

Next, as shown in FIG. 13, the photoresist layer 38 is exposed by a half-tone mask or a gray-tone mask 39.

Figure 14:
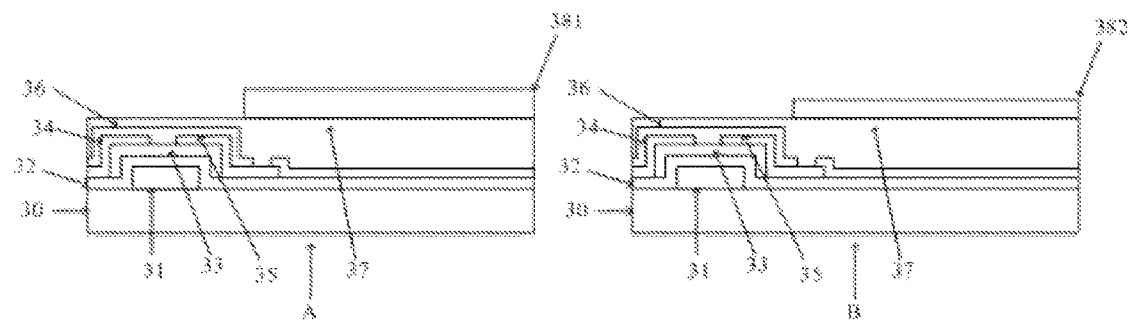
FIG. 14 is a fourth schematic view showing the structure of the TFT array substrate during performing the manufacturing method of the TFT array substrate according to the embodiment of the invention.

Then, as shown in FIG. 14, a photoresist-completely-remained region 381, a photoresist-partially-remained region 382, and a photoresist-completely-removed region are formed after the photoresist layer is developed. The photoresist-completely-remained region 381 corresponds to a region in which a pixel electrode of a first-size array substrate unit C is to be formed, the photoresist-partially-remained region 382 corresponds to a region in which a pixel electrode of a second-size array substrate unit D is to be formed, and the photoresist-completely-removed region corresponds to other regions than the above two regions.

Figure 15:
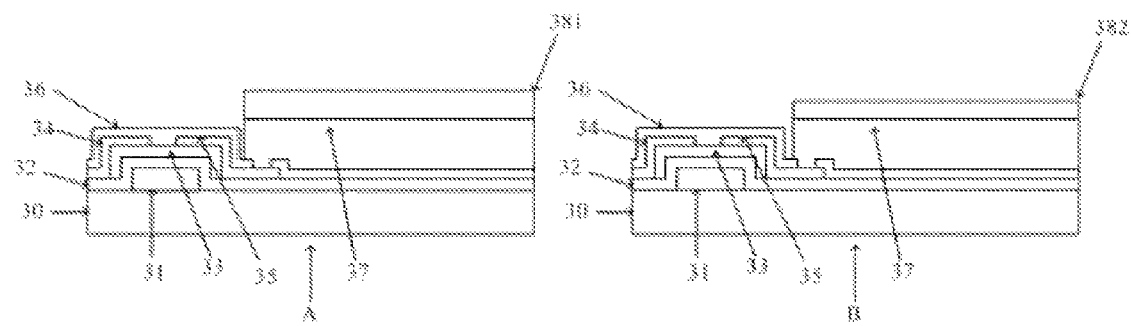
FIG. 15 is a fifth schematic view showing the structure of the TFT array substrate during performing the manufacturing method of the TFT array substrate according to the embodiment of the invention.

Next, as shown in FIG. 15, the pixel electrode layer in the photoresist-completely-removed region is removed by an etching process.

Figure 16:
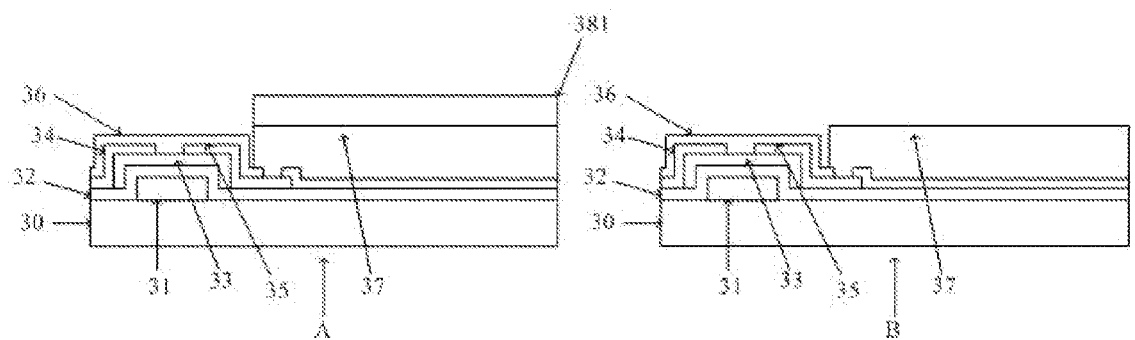
FIG. 16 is a sixth schematic view showing the structure of the TFT array substrate during performing the manufacturing method of the TFT array substrate according to the embodiment of the invention.
Figure 17:
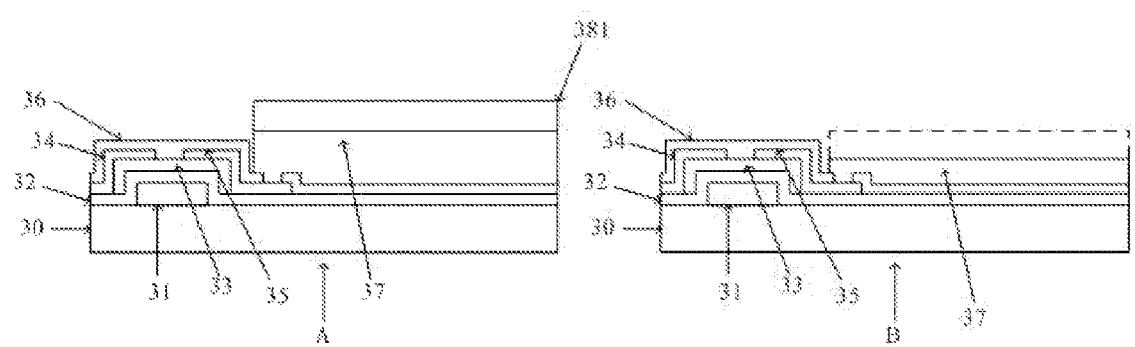
FIG. 17 is a seventh schematic view showing the structure of the TFT array substrate during performing the manufacturing method of the TFT array substrate according to the embodiment of the invention.

Then, as shown in FIG. 16, the photoresist in the photoresist-partially-remained region is removed by a plasma ashing process, for example. Next, as shown in FIG. 17, the pixel electrode layer 37 in this region is etched by a certain thickness.

Figure 18:
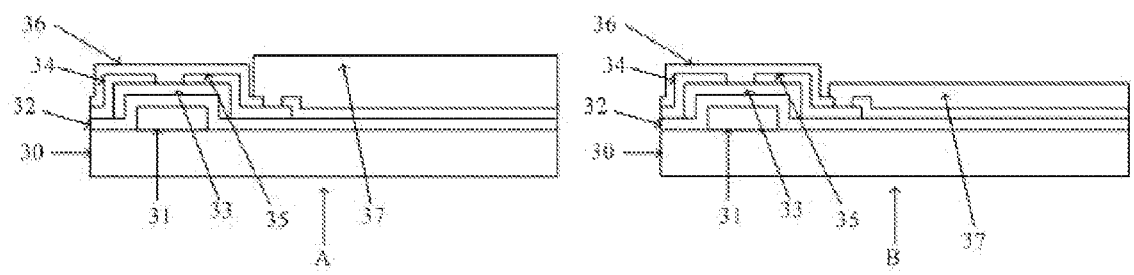
FIG. 18 is a eighth schematic view showing the structure of the TFT array substrate during performing the manufacturing method of the TFT array substrate according to the embodiment of the invention.

Finally, as shown in FIG. 18, the photoresist in the photoresist-completely-remained region is peeled off.

According to the manufacturing method of the TFT array substrate in the embodiment of the invention, the pixel electrodes of different thicknesses can be formed on the same TFT array substrate by a single patterning process with a half-tone mask or a gray-tone mask, so that display panel units of different cell gaps can be obtained in the later bonding process. Therefore, the display panel units of different sizes on the same display panel can have their desired cell gaps, and thereby the display performances of the display panel units of different sizes can be simultaneously ensured.

In addition, according to the embodiment, a TFT array substrate is provided. As shown in FIG. 18, the TFT array substrate comprises a first-size array substrate unit C and a second-size array substrate unit D, and the size of the first-size array substrate unit C is different from that of the second-size array substrate unit B. Each of the array substrate units C and D comprises a pixel electrode 37, and the thicknesses of the pixel electrode 37 of the first-size array substrate unit C is different from the thickness of the pixel electrode 37 of the second-size array substrate unit B. In FIG. 18, the thickness of the pixel electrode 37 of the first-size array substrate unit C is larger than the thickness of the pixel electrode 37 of the second-size array substrate unit D.

In this way, since the thicknesses of the pixel electrodes of the array substrate units are different from each other, display panel units of different cell gaps can be obtained in the later bonding process. Therefore, the display panel units of different sizes on the same display panel can have their desired cell gaps, and thereby the display performances of the display panel units of different sizes can be simultaneously ensured.

In this embodiment, as an example, the display panel units of different cell gaps are realized by allowing the pixel electrodes on the TFT array substrate to have different thicknesses. However, it should be noted that other structural layers such as a protective layer on the TFT array substrate may be allowed to have different thicknesses so as to realize display panel units of different cell gaps. For example, the protective layer 36 is formed on the TFT array substrate, the protective layer 36 is patterned to have different thickness by a patterning process, and then a pixel electrode layer is formed on the patterned protective layer. It should also be noted that, with regard to an LCD of horizontal electric field type, in which both the common electrode and the pixel electrode are formed on the TFT array substrate, it is obvious that the display panel units of different cell gaps may be realized by allowing the common electrodes on the TFT array substrate to have different thicknesses.

Embodiment 3

Figure 19:
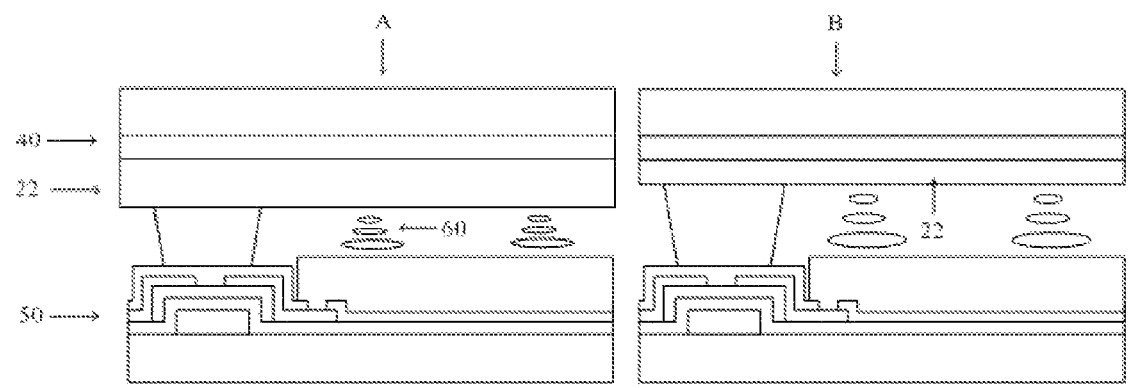
FIG. 19 is a schematic view showing a structure of a liquid crystal display panel according to an embodiment of the invention.

A LCD panel is provided according to the embodiment of the invention. As shown in FIG. 19, the LCD panel comprises a color filter substrate 40 and a TFT array substrate 50 bonded with each other and a liquid crystal layer 60 sandwiched between the color filter substrate 40 and the TFT array substrate 50. The LCD panel has a first-size LCD panel unit A and a second-size LCD panel unit B. The color filter substrate of each of the LCD panel units A and B comprises a common electrode 22, and the thicknesses of the common electrode 22 of the first-size LCD panel unit A is different from the thickness of the common electrode 22 of the second-size LCD panel unit B.

In this way, as shown in FIG. 19, the cell gap of the LCD panel unit A is smaller than the cell gap of the LCD panel unit B. Therefore, the display panel units of different cell gaps can be obtained on the same LCD panel. Therefore, the display panel units of different sizes on the same display panel can have their desired cell gaps, and thereby the display performances of the display panel units of different sizes can be simultaneously ensured.

Figure 20:
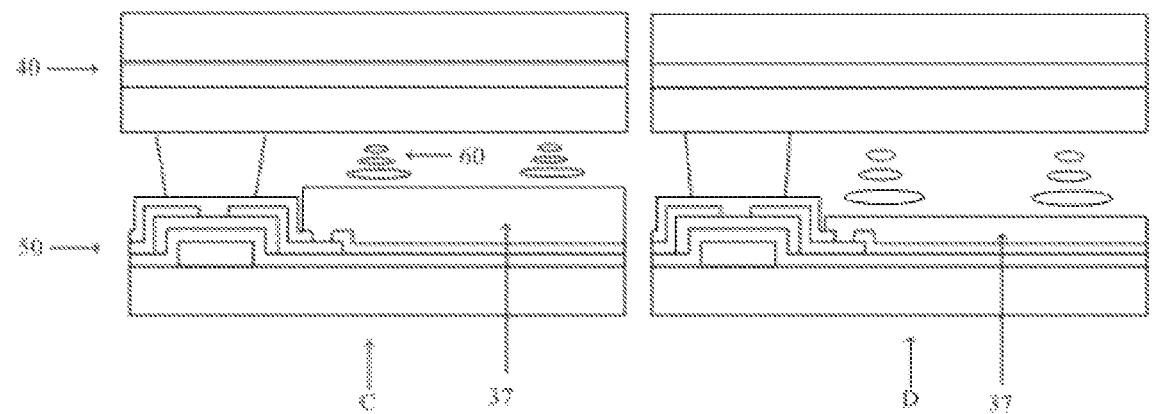
FIG. 20 is a schematic view showing a structure of another liquid crystal display panel according to an embodiment of the invention.

Another LCD panel is provided according to the embodiment of the invention. As shown in FIG. 20, the LCD panel comprises a color filter substrate 40 and a TFT array substrate 50 bonded with each other and a liquid crystal layer 60 sandwiched between the color filter substrate 40 and the TFT array substrate 50. The LCD panel has a first-size LCD panel unit C and a second-size LCD panel unit D. The array substrate of each of the LCD panel units C and D comprises a pixel electrode 37, and the thickness of the pixel electrode 37 of the first-size LCD panel unit C is different from the thickness of the pixel electrode 37 of the second-size LCD panel unit D.

In this way, as shown in FIG. 20, the cell gap of the LCD panel unit C is smaller than the cell gap of the LCD panel unit D. Therefore, the display panel units of different cell gaps can be obtained on the same LCD panel. Therefore, the display panel units of different sizes on the same display panel can have their desired cell gaps, and thereby the display performances of the display panel units of different sizes can be simultaneously ensured.

It should be noted that, in this embodiment, the display panel units of different cell gaps can be realized by allowing the common electrodes on the color filter substrate to have different thicknesses, as well as by allowing the pixel electrodes on the TFT array substrate to have different thicknesses.

It should be noted that, in the embodiments of the invention, the thickness of the common electrode layer and the thickness of the pixel electrode layer may be chosen according to practical requirements and the optical and electrical characteristics of the LCD panel units.

The embodiments described above are merely the preferred embodiments of the invention; therefore, the protection scope of the invention is not limited thereto. Any variations or alternatives that can be easily contemplated within the protection scope disclosed in the invention by anyone skilled in the art should be covered by the protection scope of the invention. Accordingly, the protection scope of the invention should be based on the protection scope of the appended claims.

What is claimed is:

1. A manufacturing method of a color filter substrate comprising:
   coating a common electrode layer on a base substrate for forming the color filter substrate;
   forming common electrodes for color filter substrate units of different sizes by performing a patterning process on the common electrode layer with a half-tone mask or a gray-tone mask, and
   dividing the color filter substrate into the color filter substrate units of different sizes,
   wherein after dividing the color filter substrate into the color filter substrate units of different sizes, the common electrodes of the color filter substrate units of different sizes have different thicknesses whereas the common electrode of each of the color filter substrate units of different sizes has a uniform thickness.

2. The method according to claim 1,
   wherein the color filter substrate has a first-size color filter substrate unit and a second-size color filter substrate unit; and
   wherein the step of forming the common electrodes for the color filter substrate units of different sizes by performing the patterning process on the common electrode layer with the half-tone mask or the gray-tone mask comprises:
   coating a photoresist layer on the common electrode layer;
   exposing the photoresist layer by the half-tone mask or the gray-tone mask, and forming a photoresist-completely-remained region, a photoresist-partially-remained region and a photoresist-completely-removed region, wherein the photoresist-completely-remained region corresponds to a region in which the common electrode of the first-size color filter substrate unit is to be formed, and the photoresist-partially-remained region corresponds to a region in which the common electrode of the second-size color filter substrate unit is to be formed;
   removing the common electrode layer in the photoresist-completely-removed region by an etching process;
   removing the photoresist in the photoresist-partially-remained region by an ashing process;
   etching away the common electrode layer in the photoresist-partially-remained region by a certain thickness; and
   peeling off the photoresist in the photoresist-completely-remained region.

3. The method according to claim 1, wherein a black matrix and a color filter layer are formed on the base substrate before coating the common electrode layer.

4. A color filter substrate, which is to be divided into color filter substrate units of different sizes, each of the color filter substrate units comprising a plurality of color filters of different colors, and
   each of the color filter substrate units comprising a common electrode, wherein after the color filter substrate is divided into the color filter substrate units of different sizes, the common electrodes of the color filter substrate units of different sizes have different thicknesses whereas the common electrode of each of the color filter substrate units of different sizes has a uniform thickness.

5. The color filter substrate according to claim 4, wherein the color filter substrate has a first-size color filter substrate unit and a second-size color filter substrate unit, the thickness of the common electrode of the first-size color filter substrate unit is different from the thickness of the common electrode of the second-size color filter substrate unit.

6. A manufacturing method of a TFT array substrate, comprising:
   coating a pixel electrode layer on a base substrate for forming the TFT array substrate; and
   forming pixel electrodes for array substrate units of different sizes by performing a patterning process on the pixel electrode layer with a half-tone mask or a gray-tone mask; and
   dividing the TFT array substrate into the array substrate units of different sizes,
   wherein after dividing the TFT array substrate into the array substrate units of different sizes, the pixel electrodes of the array substrate units of different sizes have different thicknesses whereas the pixel electrode of each of the array substrate units of different sizes has a uniform thickness.

7. The method according to claim 6,
wherein the TFT array substrate has a first-size array substrate unit and a second-size array substrate unit, and
wherein the step of forming the pixel electrodes for the array substrate units of different sizes by performing the patterning process on the pixel electrode layer with the half-tone mask or the gray-tone mask comprises:
coating a photoresist layer on the pixel electrode layer;
exposing the photoresist layer by a half-tone mask or a gray-tone mask, and forming a photoresist-completely-remained region, a photoresist-partially-remained region and a photoresist-completely-removed region, wherein the photoresist-completely-remained region corresponds to a region in which the pixel electrode of the first-size array substrate unit is to be formed, and the photoresist-partially-remained region corresponds to a region in which the pixel electrode of the second-size array substrate unit is to be formed;
removing the pixel electrode layer in the photoresist-completely-removed region by an etching process;
removing the photoresist in the photoresist-partially-remained region by an ashing process;
etching away the pixel electrode layer in the photoresist-partially-remained region by a certain thickness; and
peeling off the photoresist in the photoresist-completely-remained region.

8. The method according to claim 6, wherein a gate line, a gate electrode, a gate insulation layer, a semiconductor active layer, a data line, a source electrode, a drain electrode, and a protective layer are formed on the substrate before coating the pixel electrode layer.

* * * * *